United States Patent
Paillet et al.

(10) Patent No.: US 6,967,515 B2
(45) Date of Patent: Nov. 22, 2005

(54) SINGLE-ENDED TO DIFFERENTIAL CONVERSION CIRCUIT WITH DUTY CYCLE CORRECTION

(75) Inventors: Fabrice Paillet, Hillsboro, OR (US); David Rennie, Etobicoke (CA); Tanay Karnik, Portland, OR (US); Jianping Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/808,785

(22) Filed: Mar. 24, 2004

(65) Prior Publication Data

US 2005/0212559 A1   Sep. 29, 2005

(51) Int. Cl.[7] .............. G06F 1/04; H03F 3/04
(52) U.S. Cl. .......... 327/175; 327/132; 327/274; 330/9; 330/301; 330/253
(58) Field of Search .......... 326/115, 121, 122, 326/127, 129; 327/132, 133, 175, 172, 274, 327/280, 287, 391, 394; 330/9, 290, 250–260, 330/301

(56) References Cited

U.S. PATENT DOCUMENTS

| | | | | |
|---|---|---|---|---|
| 6,566,961 | B2 * | 5/2003 | Dasgupta et al. | 330/301 |
| 6,573,779 | B2 * | 6/2003 | Sidiropoulos et al. | 327/345 |
| 6,762,643 | B2 * | 7/2004 | Milanesi | 330/9 |
| 6,765,421 | B2 * | 7/2004 | Brox et al. | 327/175 |
| 6,806,752 | B2 * | 10/2004 | Heyne | 327/175 |

* cited by examiner

*Primary Examiner*—Vibol Tan
(74) *Attorney, Agent, or Firm*—Jeffrey B. Huter

(57) ABSTRACT

A circuit to provide a differential signal output in response to a single-ended signal input, the circuit allowing for a wide common-mode input signal by providing complementary amplifier structures.

20 Claims, 3 Drawing Sheets

US 6,967,515 B2

SINGLE-ENDED TO DIFFERENTIAL CONVERSION CIRCUIT WITH DUTY CYCLE CORRECTION

FIELD

The present invention relates to circuits, and more particularly, to analog circuits for providing a differential signal output in response to a single-ended signal input.

BACKGROUND

In many computer systems, circuits utilize static logic CMOS (Complimentary Metal Oxide Semiconductor), where the signals of interest are single-ended signals. To increase speed and noise immunity, it may be desirable for high performance computer systems to employ current-mode logic circuits utilizing differential signaling. For example, in the simplified system of FIG. 1, die 102 and die 104 may communicate to each other via die 106, where die 102 and 104 may each comprise a microprocessor and die 106 comprises a switch. Switch 106 may also allow communication with cache 108, which is not on the same die as switch 106 or microprocessors 102 and 104. For speed and noise immunity, some or all of the signaling used for communication in the system of FIG. 1 may include differential signaling with current-mode transmission circuits, but many of the circuits in the microprocessors and switch may employ static logic CMOS. Furthermore, some of the circuits used within various functional unit blocks of a microprocessor may also employ current-mode logic CMOS. Consequently, it is desirable to interface single-ended signaling with differential signaling by providing a circuit that converts a single-ended signal into a differential signal.

A prior art single-ended to differential signal conversion circuit is illustrated in FIG. 2, where a single-ended voltage signal $V_{IN}$ is applied at input port 202 and a differential voltage signal represented by the voltages $V_{OUT+}$ and $V_{OUT-}$ is taken at output ports 204 and 206, respectively. A reference voltage $V_{REF}$ is applied at port 208, which may nominally be $(V_{CC}-V_{SS})/2$ where $V_{CC}$ is the supply voltage and $V_{SS}$ is substrate (ground) voltage.

Ideally, it would be desirable for the circuit of FIG. 2 to have wide common-mode performance, that is, for the circuit performance to be the same for $V_{IN}$ above $V_{REF}$ as for $V_{IN}$ below $V_{REF}$. However, in practice, the performance is different for $V_{IN}$ in the range $[V_{SS}, (V_{CC}-V_{SS})/2]$ than for the range $[(V_{CC}-V_{SS})/2, V_{CC}]$. For example, for $V_{IN}$ close to $V_{SS}$, pFET Q3 may go out of its saturation region as its drain-to-source voltage becomes small, in which case it will not act like a high (small-signal) impedance load to nFET Q1, but for $V_{IN}$ in the range $[(V_{CC}-V_{SS})/2, V_{CC}]$, pFET Q3 will present a high (small-signal) impedance load to nFET Q1, thereby resulting in a different amplifier gain for these two voltage regions.

DESCRIPTION OF EMBODIMENTS

Figure 1:
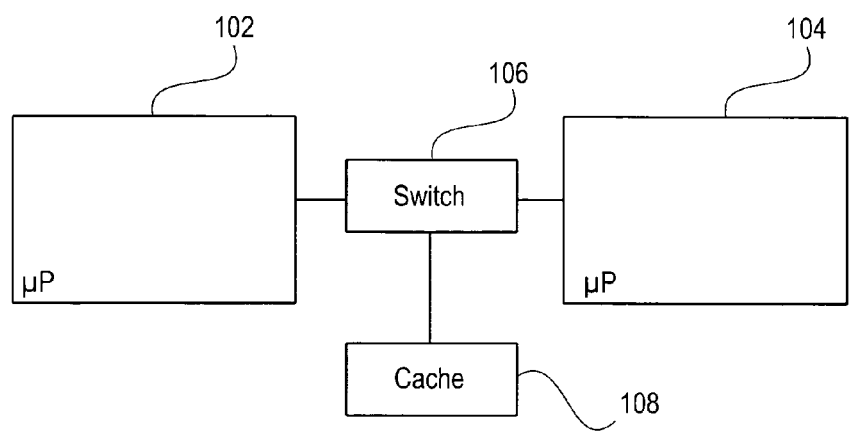
FIG. 1 is a prior art computer system which may employ the embodiments of the present invention.
Figure 2:
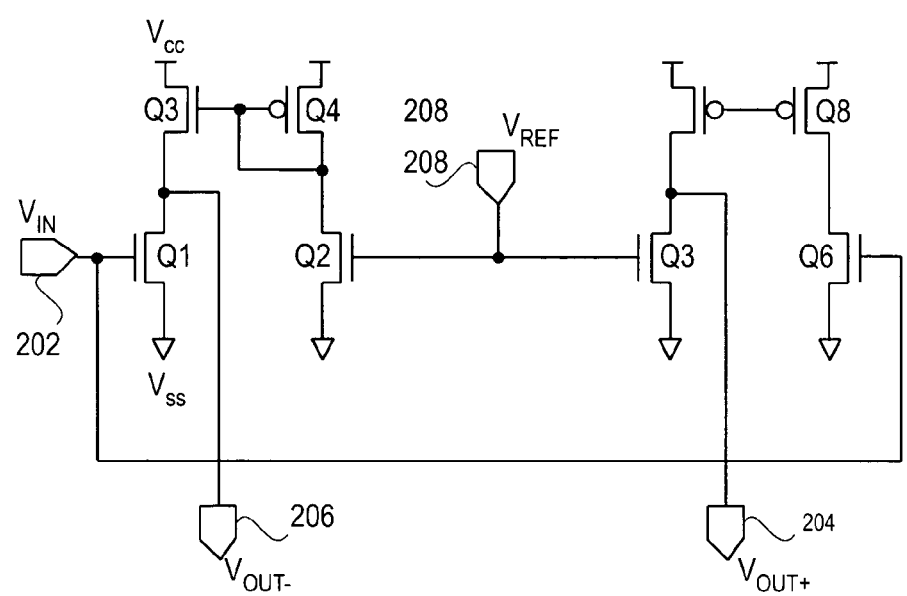
FIG. 2 is a prior art circuit for providing a differential signal output in response to a single-ended signal input.
Figure 3:
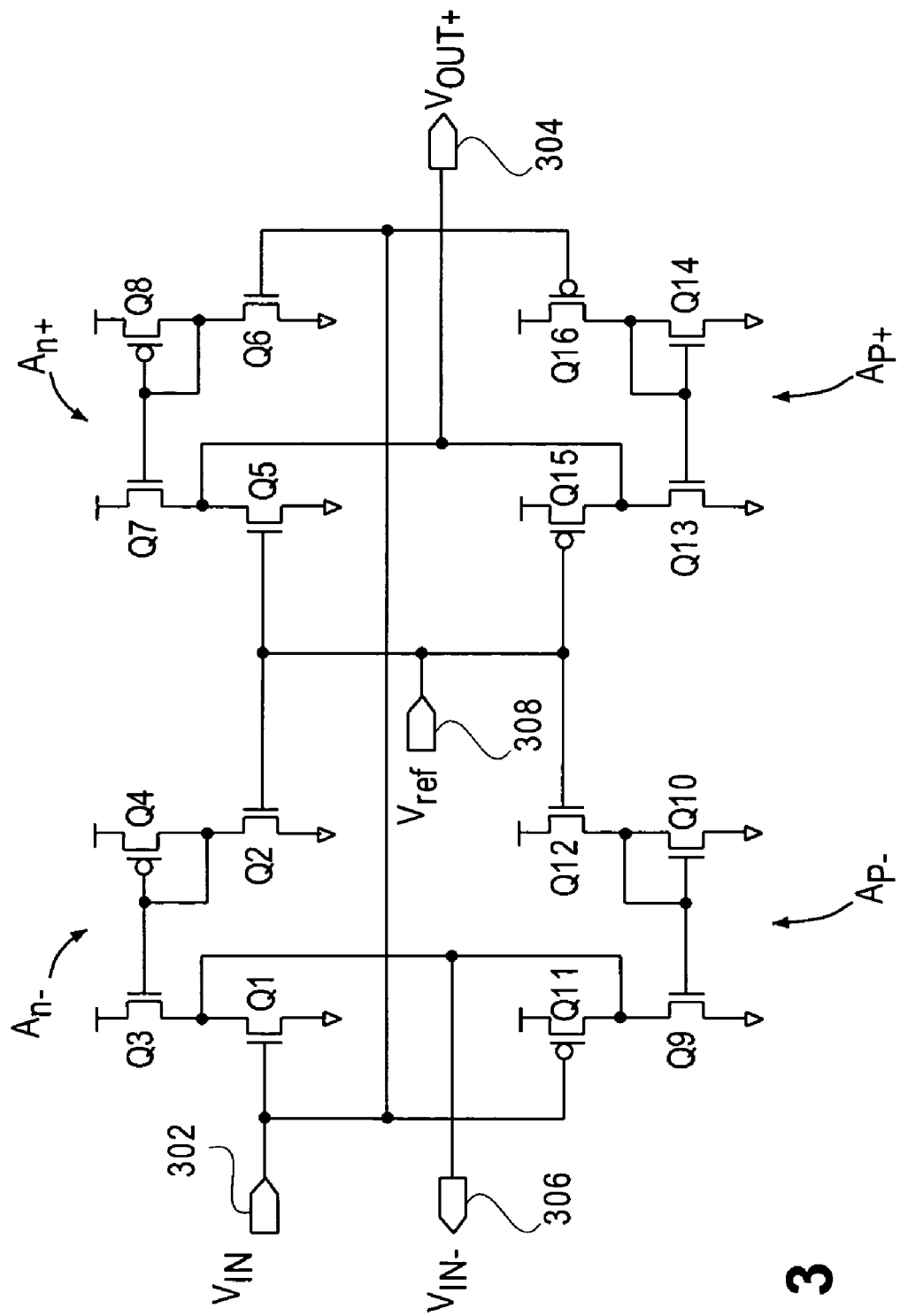
FIG. 3 is an embodiment of the present invention.

A circuit according to an embodiment of the present invention is illustrated in FIG. 3, where now reference to transistors Qi, where i is an integer from 1 to 14, now refers to transistors in FIG. 3. As for the circuit of FIG. 2, the circuit of FIG. 3 is a single-ended to differential signal conversion circuit, where a single-ended voltage signal $V_{IN}$ is applied at input port 302 and a differential voltage signal represented by the voltages $V_{OUT+}$ and $V_{OUT-}$ is taken at output ports 304 and 306, respectively. A reference voltage $V_{REF}$ is applied at port 308, which as for FIG. 2 may nominally be $(V_{CC}-V_{SS})/2$. However, the reference voltage $V_{REF}$ may be adjusted to mitigate duty cycle distortion.

The amplifier comprising transistors Q9, Q10, Q11, and Q12 may be viewed as the complementary version of the amplifier comprising transistors Q1, Q2, Q3, and Q4. Consider first the amplifier comprising transistors Q1, Q2, Q3, and Q4, which for convenience will be labeled as amplifier An−. Transistors Q1 and Q2 comprise a nFET pair, and transistors Q3 and Q4 are configured as a current mirror. With the gate of transistor Q2 biased at a constant reference voltage $V_{REF}$, transistor Q3 serves as a current source to transistor Q1. With a slight abuse of notation, let An− also denote the small-signal voltage gain of amplifier An− when transistors Q9, Q10, Q11, and Q12 are not present. (It will be clear from context whether An− refers to a voltage gain or an amplifier.) It is readily seen that amplifier An− is a common-source amplifier. Applying a simple, small-signal low-frequency model for the transistors in amplifier An− when in the active (saturation) region, such as the so-called T model, leads to an amplifier gain $$An-=(-1)g_{m1}[r_{ds1}\|r_{ds3}],$$

where $g_{m1}$ is the small-signal transconductance of transistor Q1, $r_{ds1}$ is the small-signal drain-source resistance of transistor Q1, and $r_{ds3}$ is the small-signal drain-source resistance of transistor Q3. (For convenience, we shall use the notation that $g_{m1}$ and $r_{ds1}$ are the small-signal transconductance and resistance, respectively, of transistor Qi.)

Similarly, let Ap− denote the amplifier comprising transistors Q9, Q10, Q11, and Q12, as well as its small-signal voltage gain when amplifier An− is not present. The amplifier Ap− is also readily seen as a common-source amplifier. Again, using a simple low-frequency, small-signal active region model, its voltage gain is given by $$Ap-=(-1)g_{m11}[r_{ds11}\|r_{ds9}].$$

Now let A− denote the small-signal voltage gain of the amplifier comprising both amplifiers An− and Ap− as configured in FIG. 3. Modeling the transistors in these amplifiers as before leads to the voltage gain $$A-=(-1)[g_{m1}+g_{m11}]/[r_{ds1}\|r_{ds3}\|r_{ds11}\|r_{ds9}].$$

Now consider the amplifier comprising transistors Q5 through Q8, denoted as An+ in FIG. 3, where An+ also represents its voltage gain. Assuming both $r_{ds6}$ and $r_{ds8}$ are much greater than $1/g_{m8}$, a simple low-frequency, small-signal active region model yields $$An+=[(g_{m6})(g_{m7})/(g_{m8})][r_{ds5}\|r_{ds7}].$$

The above expression for An+ could be written down by inspection by noting that amplifier An+ is similar to a common-source amplifier, except that the output port is taken at the drains of transistors Q5 and Q7, where the current mirror comprising transistors Q7 and Q8 mirrors the drain-source current of transistor Q6 to the small-signal loads provided by transistors Q5 and Q7. The voltage gain An+ is then seen to be simply the product of the transconductance of transistor Q6, $g_{m6}$, with the small-signal load provided by transistors Q7 and Q5, $[r_{ds5} \| r_{ds7}]$, scaled by the mirror gain $(g_{m7})/(g_{m8})$.

Similarly, consider the amplifier comprising transistors Q13 through Q16, denoted as Ap+ in FIG. 3, where Ap+ also represents its small-signal voltage gain. This amplifier may be viewed as similar to a common-source amplifier, but with the current mirror comprising transistors Q13 and Q14 mirroring the drain-source current of transistor Q16 to the loads provided by transistors Q13 and Q15. This voltage gain is easily seen to be $$Ap+ = [(g_{m16})(g_{m13})/(g_{m14})][r_{ds13} \| r_{ds15}].$$

Similar to the discussion regarding the combination of amplifiers An− and Ap−, if A+ represents the amplifier comprising the combination of amplifiers An+ and Ap+ with gain A+, it is easily seen that $$A+ = [(g_{m6})(g_{m7})/(g_{m8}) + (g_{m16})(g_{m13})/(g_{m14})]$$
$$[r_{ds13} \| r_{ds15} \| r_{ds15} \| r_{ds5} \| r_{ds7}].$$

From the above expressions for A+ and A−, it follows that if $(g_{m1})(g_{m8}) = (g_{m6})(g_{m7})$; $(g_{m11})(g_{m14}) = (g_{m13})(g_{m16})$; $(r_{ds1} \| r_{ds3}) = (r_{ds5} \| r_{ds7})$; and $(r_{ds11} \| r_{ds9}) = (r_{ds13} \| r_{ds15})$, then $$A+ = (-1)A-,$$

so that the circuit of FIG. 3 has the same small-signal voltage gain for $V_{OUT+}$ as for $V_{OUT-}$. (The equality signs are interpreted to mean equality within the tolerances of the process technology.) Note that $(g_{m1})(g_{m8}) = (g_{m6})(g_{m7})$ is equivalent to $(g_{m1}) = (g_{m6})[(g_{m7})/(g_{m8})]$, which may be interpreted as setting the transconductance of transistor Q1 equal to the transconductance of transistor Q6 scaled by the gain of the current mirror comprising transistors Q7 and Q8. Similarly, $(g_{m11})(g_{m14}) = (g_{m13})(g_{m16})$ is equivalent to setting the transconductance of transistor Q11 equal to the transconductance of transistor Q16 scaled by the gain of the current mirror comprising transistors Q13 and Q14. Furthermore, the equalities $(r_{ds1} \| r_{ds3}) = (r_{ds5} \| r_{ds7})$ and $(r_{ds11} \| r_{ds9}) = (r_{ds13} \| r_{ds15})$ together may be interpreted as stating that the output ports 306 and 304 are loaded by equal amounts. These equalities may be satisfied in an embodiment for which transistors Q1, Q2, Q5, and Q6 are matched to each other; transistors Q3, Q4, Q7 and Q8 are matched to each other; transistors Q9, Q10, Q13, and Q14 are matched to each other; and transistors Q11, Q12, Q15, and Q16 are matched to each other. It is to be understood that transistors are matched if they have the same physical dimension and doping profile within the tolerances of the process technology. However, the circuit is not extremely sensitive to matching at the layout level because the input signal is full swing and thus device variation would have a small effect on the output signal.

It is interesting to note that under the assumption of modeling the transistors with a simple, low-frequency, small-signal, active region model, the small-signal voltage gain for the amplifier of FIG. 3 is not really improved over the smaller circuit consisting of only amplifiers An− and An+ or only amplifiers Ap− and Ap+. This follows by inspection of the above expressions for voltage gains. For example, it is not difficult to see that $|A-| \leq |An-| + |Ap-|$ and $|A+| \leq |An+| + |Ap+|$. As a more specific example, if the small-signal drain-source resistances are such that $r_{ds1} \| r_{ds3} = r_{ds11} \| r_{ds9}$, then it follows that $A- = (An- + Ap-)/2$, the arithmetic average of the voltage gains for amplifier An− and Ap−. Similarly, if the small-signal drain-source resistances are such that $r_{ds13} \| r_{ds15} = r_{ds5} \| r_{ds7}$, then it follows that $A+ = (An+ + Ap+)/2$, the arithmetic average of the voltage gains for amplifier An+ and Ap+.

The above expressions are only correct for the model used, which assumes that the transistors are in their active regions. However, for wide common-mode signals, a some transistors may go into their linear (or triode) regions, resulting in reduced performance. For example, suppose $V_{IN}$ is near $V_{CC}$. Then nFETs Q1 and Q6 will go into their linear regions and will no longer be in their active (saturation) regions. In this case, the above expressions for amplification gain involving these nFETs are not correct. But, because the saturation region for pFETs is complementary to that of nFETs, amplifiers Ap− and Ap+ will still provide amplification because pFETs Q11 and Q16 will be in their active regions for $V_{IN}$ near $V_{CC}$.

Similarly, suppose $V_{IN}$ is near $V_{SS}$. Then nFETs Q11 and Q16 will go into their linear regions and will no longer be in their active (saturation) regions. But, amplifiers An− and An+ will still provide amplification because pFETs Q1 and Q6 will be in their active regions for $V_{IN}$ near $V_{SS}$. Consequently, the complementary topology of the circuit of FIG. 3 exhibits, for the same technology, a wider common-mode region of operation than that of FIG. 2. In this way, the circuit of FIG. 3 provides a full-swing differential output in response to a full-swing single-ended input.

Various modifications may be made to the disclosed embodiment without departing from the scope of the invention as claimed below. For example, other types of current mirrors may be employed to provide a higher small-signal load impedance, resulting in a tradeoff between bandwidth and amplifier gain. The particular embodiment of FIG. 3 has been found to operate at a clock frequency as high as 10 GHz.

It is to be understood in these letters patent that the meaning of "A is connected to B" is that A and B are connected by a passive structure for making a direct electrical connection so that the voltage potentials of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

It is also to be understood in these letters patent that a "current source" may mean either a current source or a current sink. Similar remarks apply to similar phrases, such as, "to source current".

It is also to be understood that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

It is also to be understood that a claimed equality or match is interpreted to mean an equality or match within the tolerances of the process technology.

What is claimed is:

1. A circuit comprising:
   an input port and a first output port;
   a first common-source nFET having a drain-source current and comprising a gate connected to the input port;
   a first load connected to the first output port;
   a first current mirror to mirror the drain-source current of the first common-source nFET to the first load;
   a first common-source pFET having a drain-source current and comprising a gate connected to the input port;
   a second load connected to the first output port; and
   a second current mirror to mirror the drain-source current of the first common-source pFET to the second load.

2. The circuit as set forth claim 1, further comprising:
   a second output port;
   a second common-source nFET comprising a gate connected to the input port and a drain connected to the second output port; and
   a second common-source pFET comprising a gate connected to the input port and a drain connected to the second output port.

3. The circuit as set forth in claim 2,
   wherein the first load comprises a first common-gate, common-source nFET comprising a gate biased at a reference voltage; and
   wherein the second load comprises a first common-gate, common-source pFET comprising a gate biased at the reference voltage.

4. The circuit as set forth in claim 3, the second common-source nFET having a drain-source current and the second common-source pFET having a drain-source current, the circuit further comprising:
   a second common-gate, common-source nFET comprising a gate biased at the reference voltage;
   a third current mirror to mirror the drain-source current of the second common-source nFET to the second common-gate, common-source nFET;
   a second common-gate, common-source pFET comprising a gate biased at the reference voltage; and
   a fourth current mirror to mirror the drain-source current of the second common-source pFET to the second common-gate, common-source pFET.

5. The circuit as set forth in claim 4,
   wherein the first current mirror has a first gain and the second current mirror has a second gain;
   wherein the first common-source nFET has a small-signal transconductance, and the second common-source nFET has a small-signal transconductance equal to the small-signal transconductance of the first common-source nFET scaled by the first gain; and
   wherein the first common-source pFET has a small-signal transconductance, and the second common-source pFET has a small-signal transconductance equal to the small-signal transconductance of the first common-source pFET scaled by the second gain; and
   wherein the circuit loads the first and second output ports with equal small-signal loads.

6. The circuit as set forth in claim 1,
   wherein the first load comprises a first common-gate, common-source nFET comprising a gate biased at a reference voltage; and
   wherein the second load comprises a first common-gate, common-source pFET comprising a gate biased at the reference voltage.

7. The circuit as set forth in claim 2,
   wherein the first current mirror has a first gain and the second current mirror has a second gain;
   wherein the first common-source nFET has a small-signal transconductance, and the second common-source nFET has a small-signal transconductance equal to the small-signal transconductance of the first common-source nFET scaled by the first gain; and
   wherein the first common-source pFET has a small-signal transconductance, and the second common-source pFET has a small-signal transconductance equal to the small-signal transconductance of the first common-source pFET scaled by the second gain; and
   wherein the circuit loads the first and second output ports with equal small-signal loads.

8. A circuit comprising:
   an input port and a first output port;
   a first common-source nFET comprising a gate connected to the input port and comprising a drain;
   a first current mirror comprising a first port connected to the drain of the first common-source nFET and comprising a second port;
   a first common-gate, common-source nFET comprising a drain connected to the second port of the first current mirror and to the first output port, and comprising a gate biased at a reference voltage;
   a first common-source pFET comprising a gate connected to the input port and comprising a drain;
   a second current mirror comprising a first port connected to the drain of the first common-source pFET and comprising a second port; and
   a first common-gate, common-source pFET comprising a drain connected to the second port of the second current mirror and to the first output port, and comprising a gate biased at the reference voltage.

9. The circuit as set forth in claim 8, further comprising:
   a second output port;
   a second common-source nFET comprising a gate connected to the input port and comprising a drain connected to the second output port;
   a third current mirror comprising a first port connected to the drain of the second common-source nFET and comprising a second port;
   a second common-gate, common-source nFET comprising a drain connected to the second port of the third current mirror and comprising a gate biased at the reference voltage;
   a second common-source pFET comprising a gate connected to the input port and comprising a drain connected to the second output port;
   a fourth current mirror comprising a first port connected to the drain of the second common-source pFET and comprising a second port; and
   a second common-gate, common-source pFET comprising a drain connected to the second port of the fourth current mirror and comprising a gate biased at the reference voltage.

10. The circuit as set forth in claim 9,
    wherein the first current mirror has a first gain and the second current mirror has a second gain;
    wherein the first common-source nFET has a small-signal transconductance, and the second common-source nFET has a small-signal transconductance equal to the small-signal transconductance of the first common-source nFET scaled by the first gain; and
    wherein the first common-source pFET has a small-signal transconductance, and the second common-source pFET has a small-signal transconductance equal to the small-signal transconductance of the first common-source pFET scaled by the second gain; and wherein the first current mirror and the first common-gate, common-source nFET loads the first output port with a first small-signal load, and the second common-source nFET and the third current mirror load the second output port with a small-signal load equal to the first small-signal load; and wherein the second current mirror and the first common-gate, common-source pFET loads the first output port with a second small-signal load, and the second common-source pFET and the fourth current mirror load the second output port with a small-signal load equal to the second small-signal load.

11. A circuit comprising:

an input port and a first output port;

a first common-source nFET comprising a gate connected to the input port and comprising a drain;

a first pFET comprising a drain connected to the drain of the first common-source nFET and comprising a gate connected to the drain of the first pFET;

a second pFET comprising a gate connected to the gate of the first pFET and comprising a drain;

a first common-source, common-gate nFET comprising a drain connected to the drain of the second pFET and to the first output port, and comprising a gate biased at a reference voltage;

a first common-source pFET comprising a gate connected to the input port and comprising a drain;

a first nFET comprising a drain connected to the drain of the first common-source nFET and comprising a gate connected to the drain of the first nFET;

a second nFET comprising a gate connected to the gate of the first nFET and comprising a drain; and a first common-source, common-gate pFET comprising a drain connected to the drain of the second nFET and to the first output port, and comprising a gate biased at the reference voltage.

12. The circuit as set forth in claim 11, further comprising:

a second output port;

a second common-source nFET comprising a gate connected to the input port and comprising a drain connected to the second output port;

a third pFET comprising a gate and a drain connected to the drain of the second common-source nFET;

a fourth pFET comprising a gate connected to the gate of the third pFET and comprising a drain connected to the gate of the fourth pFET;

a second common-source, common-gate nFET comprising a drain connected to the drain of the fourth pFET and comprising a gate biased at the reference voltage;

a second common-source pFET comprising a gate connected to the input port and comprising a drain connected to the second output port;

a third nFET comprising a gate and a drain connected to the drain of the second common-source pFET;

a fourth nFET comprising a gate connected to the gate of the third nFET and comprising a drain connected to the gate of the fourth nFET; and a second common-source, common-gate pFET comprising a drain connected to the drain of the fourth nFET and comprising a gate biased at the reference voltage.

13. The circuit as set forth in claim 12, wherein the first common-source nFET, the second common-source nFET, the first pFET, and the second pFET each have a small-signal transconductance such that the product of the second common-source nFET small-signal transconductance with the first pFET small-signal transconductance is equal to the product of the first common-source nFET small-signal transconductance with the second pFET small-signal transconductance; and wherein the first common-source pFET, the second common-source pFET, the first nFET, and the second nFET each have a small-signal transconductance such that the product of the second common-source pFET small-signal transconductance with the first nFET small-signal transconductance is equal to the product of the first common-source pFET small-signal transconductance with the second nFET small-signal transconductance.

14. The circuit as set forth in claim 13, wherein the second pFET, the first common-source, common-gate nFET, the third pFET and the second common-source nFET each have a small-signal drain-source resistance such that the parallel combination of the small-signal drain-source resistances for the second pFET and the first common-source, common-gate nFET is equal to the parallel combination of the small-signal drain-source resistances for the third pFET and the second common-source nFET; and wherein the second nFET, the first common-source, common-gate pFET, the third nFET and the second common-source pFET each have a small-signal drain-source resistance such that the parallel combination of the small-signal drain-source resistances for the second nFET and the first common-source, common-gate pFET is equal to the parallel combination of the small-signal drain-source resistances for the third nFET and the second common-source pFET.

15. A computer system comprising a first die and a second die in communication with the first die, the second die comprising a circuit comprising:

an input port and a first output port;

a first common-source nFET having a drain-source current and comprising a gate connected to the input port;

a first load connected to the first output port;

a first current mirror to mirror the drain-source current of the first common-source nFET to the first load;

a first common-source pFET having a drain-source current and comprising a gate connected to the input port;

a second load connected to the first output port; and a second current mirror to mirror the drain-source current of the first common-source pFET to the second load.

16. The computer system as set forth claim 15, the circuit further comprising:

a second output port;

a second common-source nFET comprising a gate connected to the input port and a drain connected to the second output port; and a second common-source pFET comprising a gate connected to the input port and a drain connected to the second output port.

17. The computer system as set forth in claim 16, wherein the first load comprises a first common-gate, common-source nFET comprising a gate biased at a reference voltage; and wherein the second load comprises a first common-gate, common-source pFET comprising a gate biased at the reference voltage.

18. The computer system as set forth in claim 17, the second common-source nFET having a drain-source current and the second common-source pFET having a drain-source current, the circuit further comprising:

a second common-gate, common-source nFET comprising a gate biased at the reference voltage;

a third current mirror to mirror the drain-source current of the second common-source nFET to the second common-gate, common-source nFET;

a second common-gate, common-source pFET comprising a gate biased at the reference voltage; and a fourth current mirror to mirror the drain-source current of the second common-source pFET to the second common-gate, common-source pFET.

19. The computer system as set forth in claim 18, wherein the first current mirror has a first gain and the second current mirror has a second gain;

wherein the first common-source nFET has a small-signal transconductance, and the second common-source nFET has a small-signal transconductance equal to the small-signal transconductance of the first common-source nFET scaled by the first gain; and wherein the first common-source pFET has a small-signal transconductance, and the second common-source pFET has a small-signal transconductance equal to the small-signal transconductance of the first common-source pFET scaled by the second gain; and wherein the circuit loads the first and second output ports with equal small-signal loads.

20. The computer system as set forth in claim 15, wherein the first load comprises a first common-gate, common-source nFET comprising a gate biased at a reference voltage; and wherein the second load comprises a first common-gate, common-source pFET comprising a gate biased at the reference voltage.

* * * * *